United States Patent [19]

Han et al.

[11] E Patent Number: Re. 32,800

[45] Reissued Date of Patent: Dec. 13, 1988

[54] METHOD OF MAKING MOSFET BY MULTIPLE IMPLANTATIONS FOLLOWED BY A DIFFUSION STEP

[75] Inventors: Yu-Pin Han, Dallas; Tsiu C. Chan, Carrollton, both of Tex.

[73] Assignee: SGS-Thomson Microelectronics, Inc., Carrollton, Tex.

[21] Appl. No.: 53,269

[22] Filed: May 21, 1987

Related U.S. Patent Documents

Reissue of:

[64] Patent No.: 4,599,118
Issued: Jul. 8, 1986
Appl. No.: 654,281
Filed: Sep. 24, 1984

U.S. Applications:

[62] Division of Ser. No. 335,608, Dec. 30, 1981, abandoned.

[51] Int. Cl.[4] ..... H01L 21/265; H01L 21/308

[52] U.S. Cl. ..... 437/27; 357/234; 357/91; 437/26; 437/44; 437/45

[58] Field of Search ..... 437/27, 26, 44, 45, 437/27; 357/91, 23.4

[56] References Cited

U.S. PATENT DOCUMENTS

| | | | |
|---|---|---|---|
| 4,078,947 | 3/1978 | Johnson et al. | 148/1.5 |
| 4,149,904 | 4/1979 | Jones | 148/1.5 |
| 4,198,250 | 4/1980 | Jecmen | 148/1.5 |
| 4,282,646 | 8/1981 | Fortino et al. | 29/571 |
| 4,317,273 | 3/1982 | Guterman et al. | 29/571 |
| 4,342,149 | 8/1982 | Jacobs et al. | 29/576 B |
| 4,354,307 | 10/1982 | Vinson et al. | 29/571 |
| 4,366,495 | 12/1982 | Goodman et al. | 357/23 VD |
| 4,376,947 | 3/1983 | Chiu et al. | 357/23 |
| 4,420,870 | 12/1983 | Kimura | 29/571 |
| 4,488,351 | 12/1984 | Momose | 29/576 B |

FOREIGN PATENT DOCUMENTS 54-136276 10/1979 Japan.

OTHER PUBLICATIONS

Ohkura et al., IEEE-Trans. Electron Devices, ED-26, (Apr. 1979), 430.

Ohta et al., IEEE-Trans. Electron Devices, ED-27, (Aug. 1980), 1352.

*Primary Examiner*—Upendra Roy

*Attorney, Agent, or Firm*—Roland Plottel

[57] ABSTRACT

A short channel metal oxide semiconductor transistor device is processed without undesirable short channel effects, such as $V_T$ falloff and with a reasonable source-drain operating voltage support. In a substrate lightly doped with P-type conductivity material and source and drain region heavily doped with an N-type conductivity material, two lightly doped N− regions are disposed between the edge of the gate and the source and drain regions. A channel region is more heavily doped with P-type material than the substrate. Two regions extend from opposite sides of the channel region to an area generally below the two N− regions and above the substrate, which regions are more heavily doped than the channel regions.

7 Claims, 2 Drawing Sheets

METHOD OF MAKING MOSFET BY MULTIPLE IMPLANTATIONS FOLLOWED BY A DIFFUSION STEP

Matter enclosed in heavy brackets [ ] appears in the original patent but forms no part of this reissue specification; matter printed in italics indicates the additions made by reissue.

This is a division of application Ser. No. 335,608, filed Dec. 30, 1981, now abandoned.

TECHNICAL FIELD

The present invention relates to a metal oxide semiconductor device and a process for fabricating such a device, more particularly to field effect transistors used in large scale integrated circuits and a process for fabricating such devices.

BACKGROUND OF THE INVENTION

Process and device technology have been developed to improve the performance of large scale integrated circuits. Increasing the density of MOS devices and LSI circuits result in improved higher speeds of operation.

Nonplanar-type devices have been proposed for such high performance LSI circuits, including a nonplanar diffusion self-aligned (DSA) MOS transistor and a VMOS transistor. These two nonplanar devices have three dimensional configurations, which increase the packing density of the LSI. However, the process for fabricating such devices include an epitaxial and a V-groove process which require a larger number of fabrication steps than that of the planar-type devices.

Planar-type devices utilized for high performance LSI circuits have generally involved scaling down the physical dimensions of the transistor. The short channel lengths involved in such scaled down transistors have involved limitations from the electrical characteristics present in such scaled down devices. The limitations on such short channel device have been the following: limited drain voltage, threshold voltage ($V_T$) falloff, and impact ionization in the drain pinchoff region. The drain voltage is limited by punch-through voltage decrease, snap back and gate field plated P-N junction avalanche breakdown. The threshold voltage falloff is limited by the drain field induced barrier lowering and the drain and source junction doping profile and substrate doping concentration. The impact ionization in the drain pinchoff region leads to hot-electron injection into the gate oxide and the substrate electron current due to secondary impact ionization.

There have been several approaches in device structures and fabrication technologies to remove some of these limitations. One fabrication technology uses a high resistivity substrate and double channel implants, where a deep implant is used to increase the punch-through voltage and a shallow implant is used to control $V_T$. A second approach has been a diffusion self-aligned MOS transistor or a double-diffused MOS transistor. This device causes double diffusion of P-type impurities from the same diffusion window, the process yields good short channel $V_T$ falloff and a source-drain breakdown control. Yet a third approach has been a lightly doped drain-source (LDD) process and a quadruply self-aligned (QSA) process. The LDD structure introduces narrow, self-aligned N-regions between the channel and the N+ source-drain diffusions of an IGFET to spread the high field at the drain pinchoff region and thus reduce the maximum field intensity. The QSA MOS device includes four mutually self-aligned areas: a narrow polysilicon gate, shallow-source/drain to eliminate short-channel effects, deep junctions for high conductance, and specific contacts to afford efficient metal innerconnection.

A need has thus arisen to develop an improved process to produce short one to two micron channel length devices without short channel $V_T$ falloff and reasonable source-drain operating voltage support.

SUMMARY OF THE INVENTION

The present invention is an improved process for fabricating a high performance LSI device without the undesirable electrical characteristics of short channel MOS transistors in such circuits. The process reduces the characteristic problems associated with short channel devices having a channel length of one to two microns.

The process includes diffusing a very light concentration of P type material, such as boron, to create a very lightly doped P−− substrate region. The source and drain regions are formed from the diffusion of a high concentration of N-type material, such as arsenic, to create an N+ region for the source and drain. A lighter concentration of N-type material is diffused in the region between the N+ material and the gate to create an N− region to reduce punch-through. A high concentration of P-type material, such as boron, is implanted at the gate and drain area to form a P region to control the drain field and drain bias, such that the fields can be limited to the drains lightly doped area. A lighter concentration of P-type material is implanted beneath the gate to form a P− region to control the $V_T$ falloff for short channel devices.

The concentration of boron at the source-gate area is similar to that in the double diffused ($D^2$) process of the applicant, but the triplé diffused ($D^3$) process of the present invention does not require the high temperature drive because of the shallow and lightly doped N-source-drain implant. The triple diffusion process of the present invention is a highly localized process in which the special features are in effect independently adjustable. The N+ junction depth ($X_j$) can be driven independently. In addition, the N− junction depth ($X_j$) and length are adjustable according to device specifications through the undercutting of the polysilicon gate.

BRIEF DESCRIPTION OF THE DRAWINGS

For a more complete understanding of the present invention of the advantages and features thereof, reference is now made to the accompanying Detailed Description taken in conjunction with the following figures in which.

DETAILED DESCRIPTION

Figure 1:
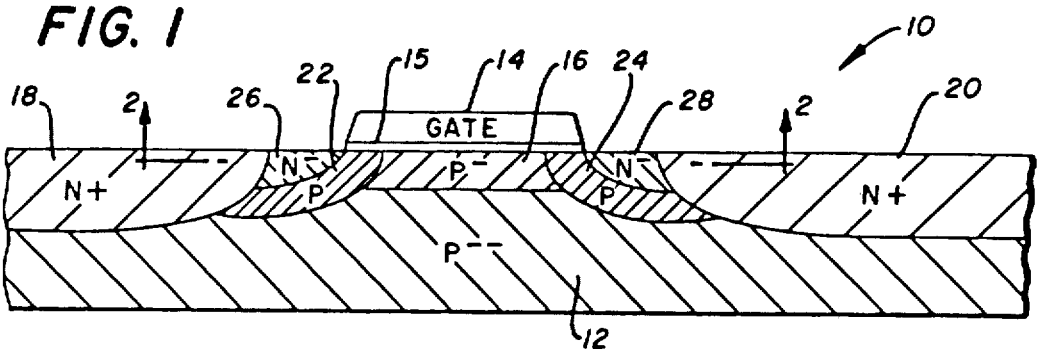
FIG. 1 is a cross sectional view of a transistor device structure of the present invention.

FIG. 1 illustrates one FET of a large scale integrated circuit fabricated in accordance with the process of the present invention, the FET device being generally identified by the reference numeral 10. The substrate region 12 of the device is a silicon material lightly doped with a P-type material, such as boron, and designated as a P−− region. A gate 14 is separated from the silicon substrate 12 by a layer of silicon dioxide 15. A channel region 16 above the P−− region 12 and below the gate 14 is slightly heavier doped with a P-type material than substrate 12 and is designated as a P− region. A source 18 and drain 20 are formed by heavily doping a region of the substrate 12 on opposite sides of the gate 14 with an N-type material and designated as an N+ region.

Two first regions 22 and 24 are doped with P-type material in a greater concentration than channel region 16, and designated as a P region, extending from beneath the edges of the gate 14 downwardly to the boundary of the N+ source 18 and drain 20. The P-type material implanted in regions 22 and 24 supports the shallow punchthrough and $V_T$ falloff.

Two second regions 26 and 28 are lightly doped with an N-type material, such as arsenic, to create shallow N− regions between the gate 14 and the N+ source 18 and drain 20. The N− regions 26 and 28 reduce the depletion at the gate 14-drain 20 region and also reduce the overlap of the gate and drain, enhancing the effect of the double diffused P-type material in regions 22 and 24.

Figure 2:
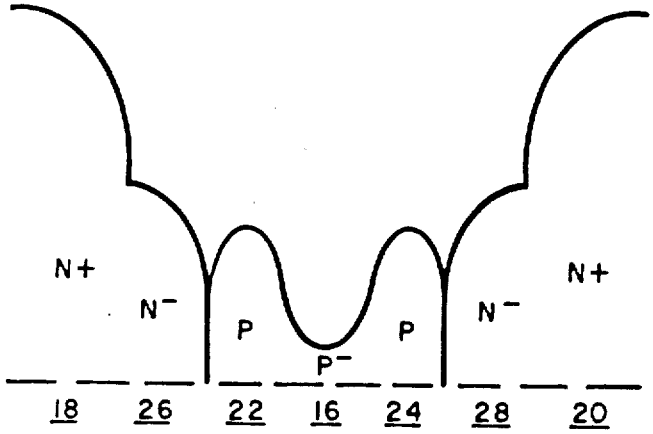
FIG. 2 is a profile of the device structure of FIG. 1 taken along the lines 2—2 in FIG. 1.

FIG. 2 illustrates a profile of the concentration of N and P-type impurities implanted into the device 10, taken along the line 2—2 of FIG. 1. The heaviest implantation of N-type material is found in the source and drain regions 18 and 20. The regions 26 and 28 are lightly doped with an N-type material to form N− regions between the N+ regions 18 and 20 and the edges of the gate region 14. The profile of the impurity concentration in the channel region, located directly beneath the gate 14 includes the P-channel region 16 beneath the center of the gate 14 and extending to regions 22 and 24 on either side, which regions contain a greater concentration of P-type material.

Figure 3:
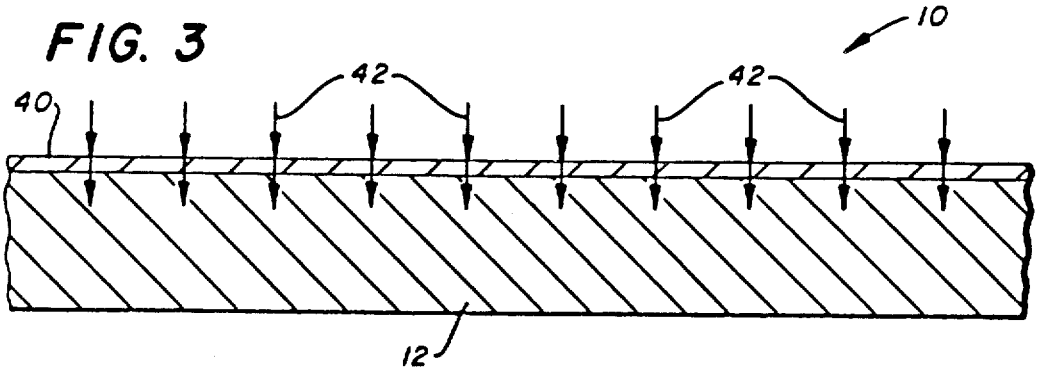
FIG. 3 illustrates the shallow boron implant step in the process.

The process of manufacturing the field effect transistor 10 begins with oxidizing the upper surface of the silicon substrate 12. As illustrated in FIG. 3, a layer of silicon dioxide 40, approximately 300 angstroms thick, is grown atop the substrate 12. A first implantation 42 of a P-type material, such as boron, occurs after the formation of the silicon dioxide layer 40. The boron implantation occurs at an intensity of about $2\times10^4$ boron ions/cm$^2$ at an energy level of 40 Kev in accordance with known ion implantation techniques. The first diffusion 42 of P-type material supports the shallow punchthrough and adjustment of the $V_T$ falloff.

The next process steps for manufacturing the FET 10 is the beginning of the formation of the polysilicon gate [14] with the deposition of a layer *14* of polysilicon material with a depth of about 5,000 angstroms, using known deposition techniques. The layer of polysilicon material is next implanted with phosphorous, an N-type material. The layer of polysilicon material implanted with phosphorous is then oxidized [with] *to form* a layer *46* of silicon dioxide *hereinafter to be termed a polyoxide layer* approximately 1,500 angstroms in thickness.

Figure 4:
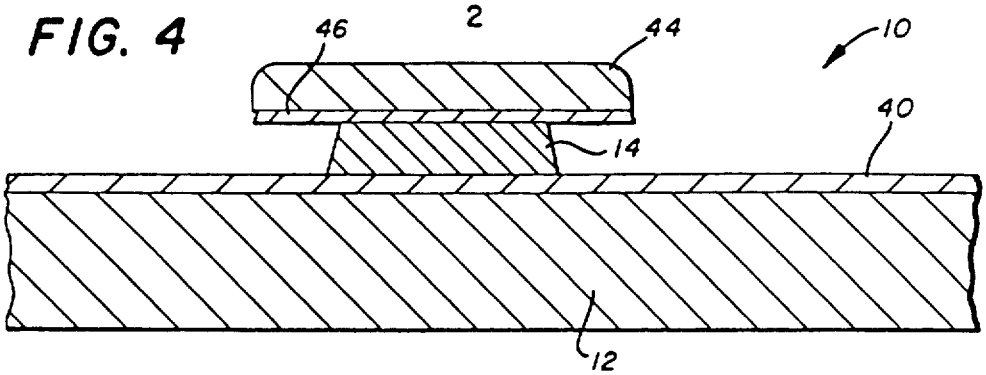
FIG. 4 illustrates the device structure after the process steps of polygate photo resist patterning, plasma etching of the oxide and polysilicon, and undercutting of the polysilicon.

FIG. 4 illustrates the next three steps in the process of manufacturing the FET device 10. The first step is the covering of the polysilicon [gate] *layer* 14 with a layer of photoresist 44, *patterning the resist in the usual fashion to essentially define the gate electrode portion* followed by a wet etching of the polysilicon oxide layer 46 and the plasma etching of the layer of polysilicon [of gate] 14 beneath it. The next step is the undercutting of the polysilicon layer of gate 14 beneath the polyoxide layer 46 *to achieve the stage shown in FIG. 4*. The distance the polysilicon layer is undercut allows for the adjustment of the N− regions 26 and 28 (FIG. 1). The photoresist layer 44 is then stripped, using conventional techniques.

Figure 5:
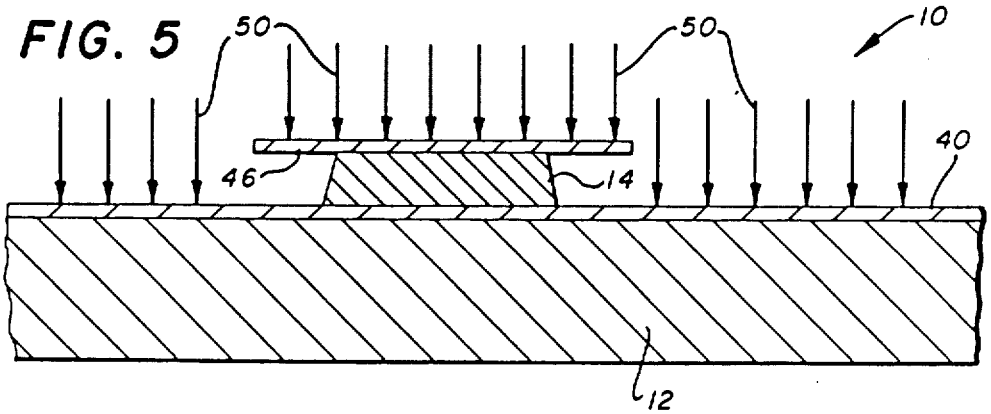
FIG. 5 illustrates the diffusion of arsenic impurity material to the device structure.

FIG. 5 illustrates the implantation step 50 of an N-type material, such as arsenic, for forming the heavily doped N+ regions 18 and 20 for the source and drain of the FET 10. The energy of the arsenic ion is selected so as to penetrate only through the portions not covered by the [polysilicon oxide] *polyoxide* layer 46. An intensity of about $2\times10^{16}$ arsenic ions/cm$^2$ with an energy level of 60 Kev is selected, using known ion implantation techniques. Following the implantation of the arsenic, the [silicon dioxide] *polyoxide* layer 46 is etched away.

Figure 6:
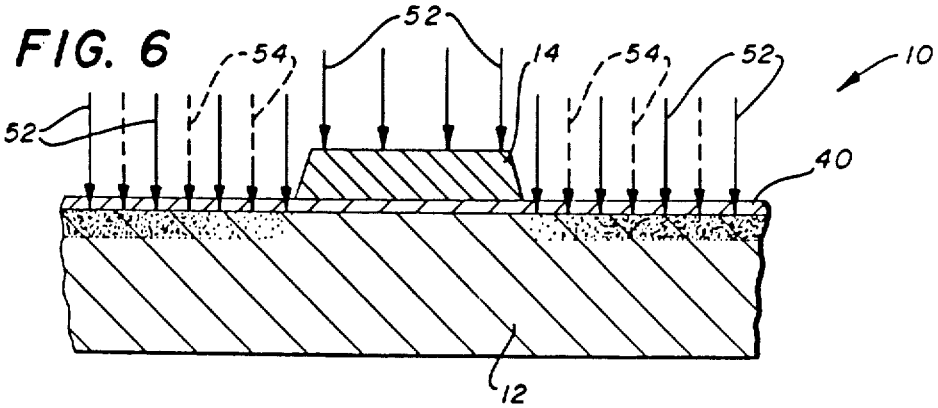
FIG. 6 illustrates a light diffusion of arsenic material and boron implant.

FIG. 6 illustrates an implantation step 52 of N-type material, such as arsenic, as indicated by the solid arrows, for forming regions 26 and 28. The intensity of the arsenic ions is $1\times10^{13}$ arsenic ions/cm$^2$ with an energy level of 60 Kev. The implantation step 52 provides a lightly doped area forming the N− region 26 and 28, which are between gate region 14, and a heavier N+ region 18 and 20 for the source and drain. A second implantation 54 of P-type material, such as boron, is indicated by the dashed arrow in FIG. 6. An intensity of about $5\times10^{12}$ boron ions/cm$^2$ with an energy level of 35 Kev is used in accordance with known ion implantation techniques. The triple diffusion process is the implantation step 50 to form N+ regions 18 and 20, the implantation step 52 to form N− regions 26 and 28, and the implantation step 54 to form the P regions 22 and 24.

Figure 7:
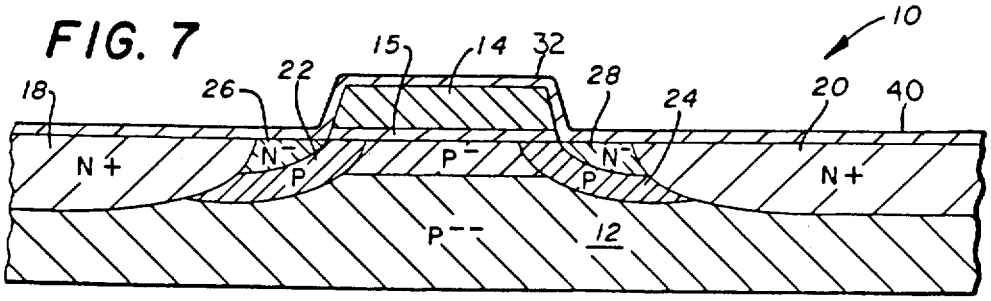
FIG. 7 illustrates the process of driving the arsenic and boron impurities into the substrate and oxidizing the surface.

FIG. 7 illustrates the next process step of thermally oxidizing the upper layer of the [FET 10, and the] *silicon wafer to form layer 32. The* oxidation process drives the boron [D$^2$] implantation to greater depths within the substrate 12. Following *selective removal of portions of layer 32 where the contacts are to be provided, there follows* a metalization process to form the contacts, *and thus* the metal oxide semiconductor FET transistor structure 10 has been constructed.

The process described above for manufacturing the metal oxide semiconductor FET 10 has a number of advantages over previous device processes. The principle advantage is the individual adjustment of special features of the device 10. The substrate 12 with it lightly doped P−− region has high resistivity. The N+ regions of the source 18 and drain 20 can be driven independently to adjust the penetration of the N+ region into the substrate. The double diffusion of the boron does not need as long a drive time as in previous processes, since the N− region is a lightly doped region of N-type material, and the double diffused boron can be driven at the same time the N− material is driven. The N− regions at the edge of gate 14 are adjustable according to manufacturer's specifications. As indicated above, the N− region can be controlled by the undercutting of the polysilicon gate 14. Finally, there is a small overlap capacitance between the polysilicon gate 14 and the source/drain in the semiconductor device 10 made in accordance with the present invention.

In one semiconductor device 10 manufactured in accordance with the present invention, the gate 14 had a length of approximately 1.5 microns, the source and drain N+ region had a $X_j$ dimension of 0.7 microns, the N− regions have a $X_j$ dimension of approximately 1.5 microns, and the P-type regions 22 and 24 had a thickness of approximately 0.3 microns.

Although a preferred embodiment of the invention has been illustrated in the accompanying Drawings and described in the foregoing Detailed Description, it will be understood that the invention is not limited to the embodiments disclosed herein, but they are capable of numerous rearrangements, modifications and substitution without departing from the spirit of the invention.

What is claimed is:

1. A method for manufacturing a metal oxide semiconductor transistor device comprising:

providing a semiconductor substrate of a first conductivity type;

forming a first insulating layer of silicon dioxide on an active surface of the substrate;

implanting ions of a first conductivity type into said substrate;

depositing a layer of polysilicon on said first insulating layer;

implanting ions of a second conductivity type through said polysilicon layer;

growing a second region of silicon dioxide, said silicon dioxide region being grown over said polysilicon layer;

placing a photoresistive mask over said second oxidation layer for forming a gate of the semiconductor device;

etching a predetermined portion of said second oxidation layer;

plasma etching said polysilicon layer;

removing a predetermined portion of said polysilicon layer underneath said second silicon dioxide layer;

[etching said second layer of silicon dioxide;]

stripping said photoresist area from said second oxidation layer;

implanting ions of the second conductivity type;

[implanting ions of the first conductivity type;]

etching said second layer of silicon dioxide overhanging said polysilicon gate layer;

[etching said first layer of silicon dioxide surrounding said polysilicon gate layer;]

implanting ions of said first conductivity type;

implanting ions of said second conductivity type;

diffusing the implanted ions into said substrate; and oxidizing the active surface of said substrate, including said polysilicon gate.

2. The method of making a metal oxide semiconductor transistor device of claim 1, wherein the implantation of ions of the first conductivity type are boron ions and the implantation of ions of the second conductivity type are arsenic ions.

*3. A method for forming an MOS transistor comprising the steps of*

*providing a silicon wafer of p-type,*

*forming a gate oxide layer over the top surface of the wafer,*

*implanting acceptor ions non-selectively into the top surface of the wafer,*

*depositing a polysilicon layer over the gate oxide layer,*

*oxidizing the top surface of the polysilicon layer to form a polyoxide layer,*

*depositing a layer of photoresist over the polysilicon layer and patterning the photoresist to leave a selected portion overlying the polyoxide layer,*

*using a selected portion of the photoresist while etching the polyoxide layer and the polysilicon layer and undercutting the polyoxide layer a prescribed amount,*

*implanting donor ions selectively into the wafer using the polyoxide layer and the polysilicon layer as a mask,*

*removing the polyoxide layer from the top surface of the polysilicon layer,*

*implanting donor and acceptor ions selectively into the wafer using the polysilicon layer as a mask, and*

*heating the wafer for diffusing the implanted acceptor ions deeper into the wafer than the implanted donor ions.*

*4. The process of claim 3 in which the acceptor ions implanted are boron ions and the donor ions implanted are arsenic ions.*

*5. The process of claim 3 which includes the further steps of providing separately a gate connection to the polycrystalline layer, and source and drain connections to the donor-rich surface layer portions adjacent to the acceptor-rich region underlying the polycrystalline layer.*

*6. The method of claim 3 wherein the implantation of ions of the first conductivity type are boron ions and the implantation of ions of the second conductivity type are arsenic ions.*

*7. A method for manufacturing a metal oxide semiconductor transistor device characterized in that it comprises the following steps:*

*providing a semiconductor substrate (12) of a first conductivity type,*

*forming a first insulating layer (40) of silicon dioxide on an active surface of the substrate,*

*implanting (42) ions of a first conductivity type into said substrate,*

*depositing a layer (14) of polysilicon on said first insulating layer,*

*implanting ions of a second conductivity type in said polysilicon layer,*

*growing a second region (46) of silicon dioxide, said silicon dioxide region being grown over said polysilicon layer,*

*placing a photoresistive mask (44) over said second silicon dioxide region*

*etching a predetermined portion of said second dioxide region and plasma etching said polysilicon layer; to leave a double layer of silicon dioxide and polysilicon longer than desire for the gate,*

*removing a predetermined portion of said polysilicon layer underneath said second silicon dioxide layer to realize the polysilicon gate (14)*

*stripping the photoresist mask from said second silicon dioxide layer leaving a portion of the second layer of silicon dioxide overhanging said polysilicon gate*

*implanting (50) ions of the second conductivity type by using said second layer of silicon dioxide as a mask for forming heavily doped regions*

*etching said second layer (46) of silicon dioxide overhanging said polysilicon gate layer*

*implanting (52) ions of said second conductivity type for forming lightly doped regions between the gate region and the heavily doped regions*

*implanting (54) ions of said first conductivity type for forming doped regions under the edges of the gate*

*diffusing the implanted ions into said substrate, and oxidizing the active surface of said substrate, including said polysilicon gate.*

* * * * *